United States Patent
Chen et al.

(10) Patent No.: US 10,756,735 B2
(45) Date of Patent: *Aug. 25, 2020

(54) TEMPERATURE INSTABILITY-AWARE CIRCUIT

(71) Applicant: Taiwan Semiconductor Manufacturing Co., Ltd., Hsin-Chu (TW)

(72) Inventors: Chia-Hui Chen, Hsinchu (TW); Wan-Yen Lin, Kaohsiung (TW); Tsung-Hsin Yu, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/654,677

(22) Filed: Oct. 16, 2019

(65) Prior Publication Data

US 2020/0052699 A1 Feb. 13, 2020

Related U.S. Application Data

(63) Continuation of application No. 16/156,507, filed on Oct. 10, 2018, now Pat. No. 10,483,973.

(Continued)

(51) Int. Cl.
| | | |
|---|---|---|
| *H03K 19/003* | (2006.01) | |
| *H03K 17/00* | (2006.01) | |
| *H03K 3/356* | (2006.01) | |

(52) U.S. Cl.
CPC . *H03K 19/00384* (2013.01); *H03K 3/356113* (2013.01)

(58) Field of Classification Search
CPC .................. H03K 19/00384; H03K 3/356113
See application file for complete search history.

(56) References Cited

U.S. PATENT DOCUMENTS

| | | | |
|---|---|---|---|
| 5,036,232 | A | 7/1991 | Jungert |
| 5,128,567 | A | 7/1992 | Tanaka |

(Continued)

FOREIGN PATENT DOCUMENTS

| | | |
|---|---|---|
| JP | H0257733 A | 2/1990 |
| JP | 2010109969 A | 5/2010 |

(Continued)

OTHER PUBLICATIONS

Official Action dated Jul. 29, 2019, in corresponding Taiwan Patent Application No. 10-2018-0153761.

*Primary Examiner* — Kenneth B Wells
(74) *Attorney, Agent, or Firm* — Duane Morris LLP

(57) ABSTRACT

A circuit includes: a first swing reduction circuit coupled between an input/output pad and a buffer circuit, and a second swing reduction circuit coupled between the input/output pad and the buffer circuit. The first swing reduction circuit comprises a first transistor gated by a first bias voltage and comprises a second transistor drained by the first bias voltage. The first swing reduction circuit is configured to increase a voltage at a first node in the buffer circuit when a voltage applied on the input/output pad is equal to a first supply voltage. The second swing reduction circuit is configured to reduce a voltage at a second node in the buffer circuit when the voltage applied on the input/output pad is equal to a second supply voltage.

20 Claims, 6 Drawing Sheets

Related U.S. Application Data

(60) Provisional application No. 62/595,469, filed on Dec. 6, 2017.

(56) References Cited

U.S. PATENT DOCUMENTS

| | | |
|---|---|---|
| 5,231,311 A | 7/1993 | Ferry |
| 5,266,848 A | 11/1993 | Nakagome et al. |
| 5,854,567 A | 12/1998 | Meier et al. |
| 6,227,637 B1 | 5/2001 | Phan |
| 6,548,994 B2 | 4/2003 | Jang et al. |
| 6,753,707 B2 | 6/2004 | Honda |
| 10,483,973 B2 * | 11/2019 | Chen ................ H03K 3/356113 |
| 2007/0030066 A1 | 2/2007 | Sohn et al. |
| 2008/0231322 A1 | 9/2008 | Mohammad et al. |
| 2010/0102872 A1 | 4/2010 | Wu et al. |

FOREIGN PATENT DOCUMENTS

| | | |
|---|---|---|
| KR | 970701947 A | 4/1997 |
| KR | 20020085992 A | 11/2002 |
| KR | 100378036 B1 | 3/2003 |
| KR | 100442592 B1 | 7/2004 |
| KR | 100609619 B1 | 7/2006 |
| KR | 101154109 B1 | 6/2012 |

* cited by examiner

TEMPERATURE INSTABILITY-AWARE CIRCUIT

CROSS-REFERENCE TO RELATED APPLICATIONS

The present application is a continuation of U.S. patent application Ser. No. 16/156,507, filed on Oct. 10, 2018, now U.S. Pat. No. 10,483,973, issued on Nov. 19, 2019, which claims priority to U.S. Provisional Patent Application No. 62/595,469, filed on Dec. 6, 2017, each of which is incorporated by reference herein in its entirety.

BACKGROUND

Continuing advances in technologies have led to increasingly reducing the physical sizes of metal-oxide-semiconductor field-effect-transistors (MOSFETs). Magnitudes of supply voltages have been accordingly reduced to save power as well as to accommodate the reduction in the physical sizes of the MOSFETs, and respective threshold voltages ($V_{th}$s) of the MOSFETs have also been reduced to mitigate performance degradation effects of reduced MOSFET gate voltages resultant from the reduction of supply voltages. As a result, a Bias Temperature Instability (BTI) effect, causing a change in the magnitude of the MOSFET's $V_{th}$, has become a concern.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

Figure 1:
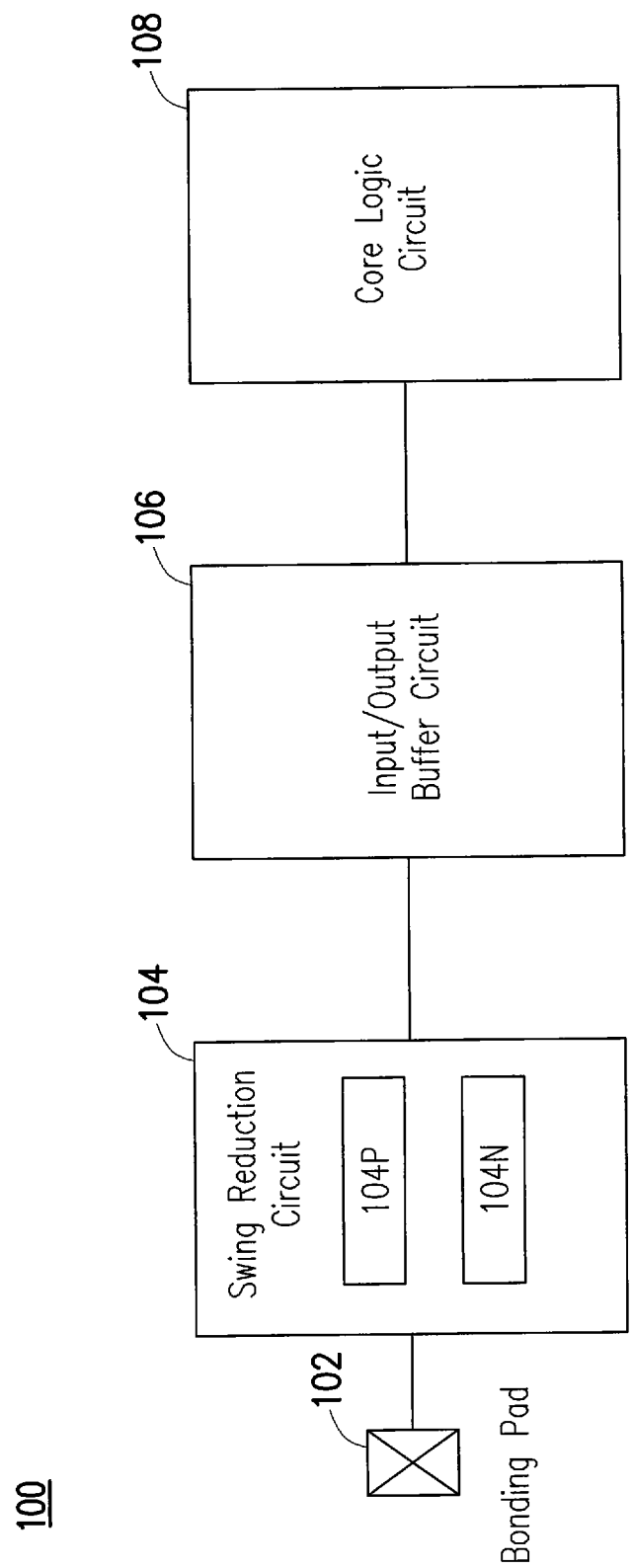
FIG. 1 illustrates an exemplary block diagram of a circuit including a swing reduction circuit, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

A BTI effect is a device degradation mechanism identified in sub-100 nm MOSFETs. For example, when the gate of a p-type MOSFET is negatively biased with respect to its source at an elevated temperature, oxide interface traps are generated due to an interaction of holes in the channel inversion layer with gate oxide. The instability is measured as an increase in the magnitude of the p-type MOSFET's $V_{th}$. Higher stress temperatures generally produce more degradation. Similar degradation occurs to an n-type MOSFET when the gate of the n-type MOSFET is positively biased with respect to its source. In general, the BTI effects observed in p-type and n-type MOSFETs are referred to as "Negative BTI (NBTI) effect" and "Positive BTI (PBTI) effect," respectively. The NBTI/PBTI effect is known to cause reliability performance degradation for the MOSFET because of the change in $V_{th}$.

Such BTI effects can cause a more serious issue to an input/output (I/O) buffer circuit because, typically, the I/O buffer circuit is directly coupled to a bonding pad configured to receive a supply voltage, whose magnitude ranges from a minimum nominal voltage (e.g., a voltage source source or a ground voltage (VSS)) to a maximum nominal voltage (e.g., a voltage drain drain or a power supply voltage (VDD)). Due to such a relatively great change in the magnitude of the voltage received, the I/O buffer circuit, which is configured to avoid noise associated with the supply voltage from receiving by a core logic circuit, may become malfunctioning over the time of use. Existing techniques to resolve this issue generally rely on prediction models to simulate the BTI effects. To assure the reliability of the I/O buffer circuits, the prediction models frequently lead to an overdesign on various physical features of the I/O buffer circuits, which, in turn, can cause other issues such as, for example, a trade-off on a usable area, a trade-off on timing performance, etc. Thus, existing techniques to provide reliable I/O buffer circuits are not entirely satisfactory.

The present disclosure provides various embodiments of a swing reduction circuit coupled between a bonding pad and an input/output (I/O) buffer circuit. In some embodiments, the swing reduction circuit includes a p-type swing reduction circuit that is coupled to respective gates of a subset of p-type metal-oxide-semiconductor field-effect-transistors (pMOSFETs) of the I/O buffer circuit, and/or an n-type swing reduction circuit that is coupled to respective gates of a subset of n-type metal-oxide-semiconductor field-effect-transistors (nMOSFETs) of the I/O buffer circuit. In some embodiments, the p-type swing reduction circuits are configured to increase the lower bound of a magnitude of a voltage swing received by the gates of the subset of pMOSFETs of the I/O buffer circuit; and the n-type swing reduction circuits are configured to decrease the higher bound of a magnitude of the voltage swing received by the gates of the subset of nMOSFETs of the I/O buffer circuit. Accordingly, the magnitude of the voltage swing received by the respective gates of the subsets of pMOSFETs and nMOSFETs is decreased. Due to such a decreased magnitude of the voltage swing, the above-mentioned NBTI and PBTI effects can be substantially depressed to occur to the coupled I/O buffer circuit.

FIG. 1 illustrates a block diagram of an exemplary circuit 100, in accordance with various embodiments. The circuit 100 includes a bonding pad 102, a swing reduction circuit 104, an input/output (I/O) buffer circuit 106, and a core logic circuit 108. In some embodiments, the bonding pad 102 is configured to receive a supply voltage from a voltage source (not shown); the swing reduction circuit 104, coupled to the bonding pad 102, is configured to reduce the magnitude of a voltage swing received by the I/O buffer circuit 106; and the I/O buffer circuit 106, coupled to the swing reduction circuit 104, is configured to prevent noise associated with the supply voltage from being received by the coupled core logic circuit 108 (e.g., any of various digital circuits that perform the main functions of the whole circuit 100).

In some embodiments, the I/O buffer circuit 106 includes one of various buffer circuits known in the art that can perform the above-mentioned function such as, for example, a Schmitt Trigger circuit, an inverter circuit, etc. According to some embodiments, the I/O buffer circuit 106 is formed by a plurality of pMOSFETs and a plurality of nMOSFETs, which will be discussed below. To assure the pluralities of pMOSFETS and nMOSFETs to minimally suffer the BTI effects, in some embodiments, the swing reduction circuit 104 may include a p-type swing reduction circuit 104P and an n-type swing reduction circuit 104N configured to minimize the NBTI effect that may occur to the plurality of pMOSFETs of the I/O buffer circuit 106 and the PBTI effect that may occur to the plurality of nMOSFETs of the I/O buffer circuit 106, respectively.

More specifically, in some embodiments, the p-type swing reduction circuit 104P is configured to increase the magnitude of a voltage received by respective gates of the plurality of pMOSFETs of the I/O buffer circuit 106 when the magnitude of the supply voltage, received by the bonding pad 102, is equal to a minimum nominal voltage, for example, a voltage source source (VSS); and the n-type swing reduction circuit 104N is configured to decrease the magnitude of a voltage received by respective gates of the plurality of nMOSFETs of the I/O buffer circuit 106 when the magnitude of the supply voltage, received by the bonding pad 102, is equal to a maximum nominal voltage, for example, a voltage drain drain (VDD). As such, the magnitude of the voltage swing, received by the respective gates of the pluralities of pMOSFETs and nMOSFETs of the I/O buffer circuit 106, can be substantially reduced, which advantageously lengthens the lifetime of the I/O buffer circuit 106 without making any of the above-mentioned trade-offs (because of no overdesign on the I/O buffer circuit 106).

It is noted that the swing reduction circuit 104 may include only one of the p-type swing reduction circuit 104P and the n-type swing reduction circuit 104N, according to some embodiments. When the plurality of nMOSFETs of the I/O buffer circuit 106 do not have the concern of the PBTI effect, for example, the swing reduction circuit 104 may not include the n-type swing reduction circuit 104N. Similarly, when the plurality of pMOSFETs of the I/O buffer circuit 106 do not have the concern of the NBTI effect, for example, the swing reduction circuit 104 may not include the p-type swing reduction circuit 104P.

Figure 2A:
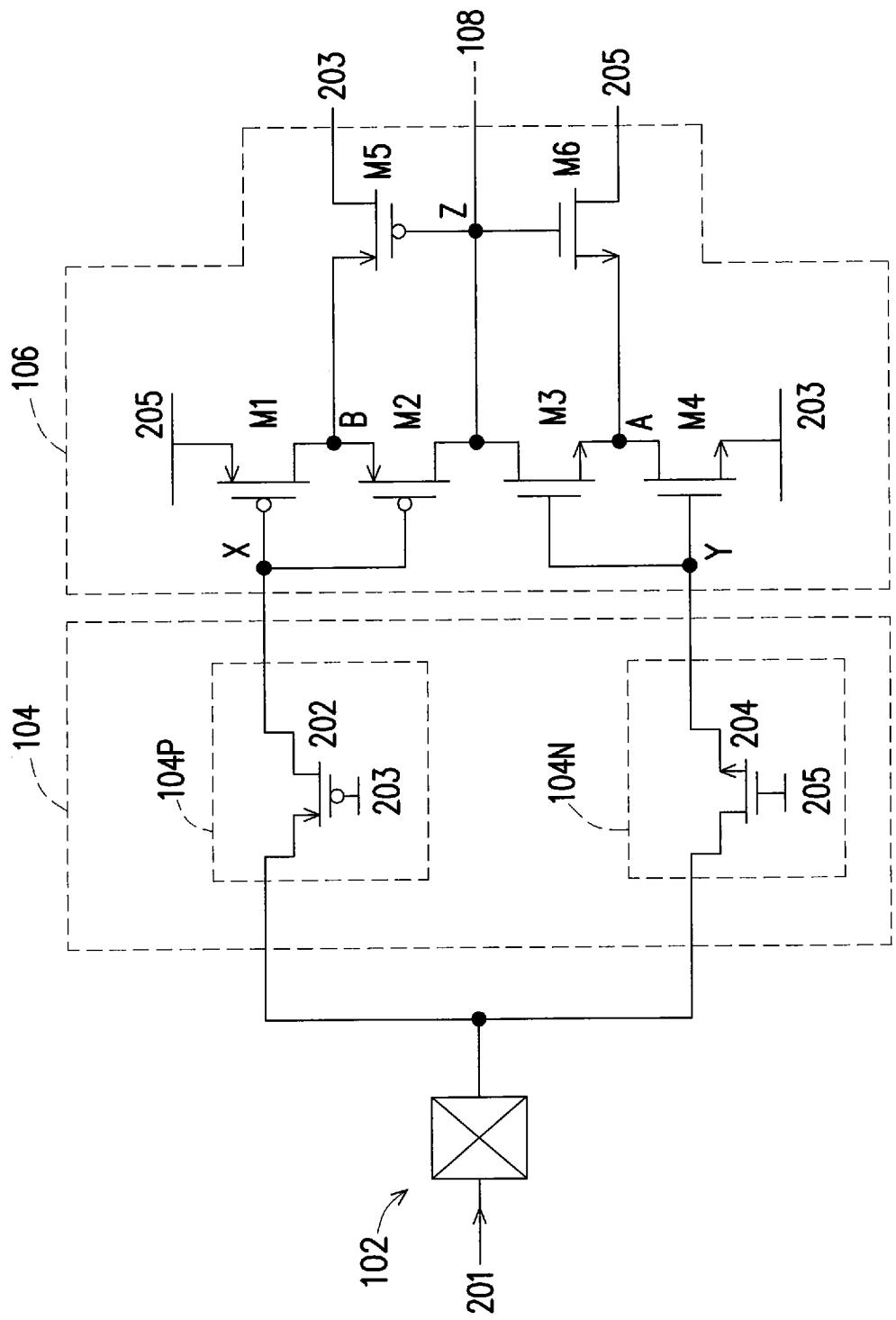
FIG. 2A illustrates an exemplary circuit diagram of the swing reduction circuit, in accordance with some embodiments.

FIG. 2A illustrates respective schematic diagrams of the p-type swing reduction circuit 104P and the n-type swing reduction circuit 104N, in accordance with an embodiment of the present disclosure. In the illustrated embodiment of FIG. 2A, the p-type swing reduction circuit 104P and the n-type swing reduction circuit 104N are respectively coupled between the bonding pad 102 and the I/O buffer circuit 106, which is implemented by a Schmitt Trigger circuit. Although the I/O buffer circuit 106 includes a Schmitt Tigger circuit in FIG. 2A, it is understood that the I/O buffer circuit 106 can include any of the buffer circuits known in the art while remaining within the scope of the present disclosure.

As mentioned above, in some embodiments, the bonding pad 102 is configured to receive a supply voltage 201. The magnitude of such a supply voltage 201 may range from a minimum nominal voltage (e.g., a voltage source source (VSS)) to a maximum nominal voltage (e.g., a voltage drain drain (VDD)). In some embodiments, the p-type swing reduction circuit 104P includes a transistor 202 (e.g., a pMOSFET) with its gate coupled to a supply voltage 203 whose magnitude is equal to VSS, which corresponds to a low logic state. As such, the transistor 202 is turned on, for example, operating at a linear conduction mode. It is understood that the transistor 202 can be implemented by any of other various transistors (e.g., a bipolar junction transistor (BJT), a high-electron-mobility field-effect-transistor (HEMFET), etc.) while remaining within the scope of the present disclosure. On the other hand, the n-type swing reduction circuit 104N includes a transistor 204 (e.g., an nMOSFET) with its gate coupled to a supply voltage 205 whose magnitude is equal to VDD, which corresponds to a high logic state. As such, the transistor 204 is turned on, for example, operating at a linear conduction mode. It is understood that the transistor 204 can be implemented by any of other various transistors (e.g., a bipolar junction transistor (BJT), a high-electron-mobility field-effect-transistor (HEMFET), etc.) while remaining within the scope of the present disclosure. In some embodiments, the bonding pad 102 is commonly coupled to a source of the transistor 202 and a drain of the transistor 204. A drain of the transistor 202 is coupled to a node "X," and a source of the transistor 204 is coupled to a node "Y."

In accordance with some embodiments, the I/O buffer circuit 106, which is implemented as a Schmitt Trigger circuit, includes transistors M1, M2, M3, M4, M5, and M6. Although in the illustrated embodiment of FIG. 2A, the transistors M1, M2, and M5 are each implemented by a pMOSFET and the transistors M3, M4, and M6 are each implemented by an nMOSFET, it is understood that the transistors M1 to M6 can be implemented by any of other transistors while remaining within the scope of the present disclosure. The I/O buffer circuit 106 is coupled between (e.g., biased by) the supply voltages 205 (VDD) and 203 (VSS). Specifically, sources of the transistors M1 and M4 are coupled to the supply voltages 205 (VDD) and 203 (VSS), respectively. Respective gates of the transistors M1 and M2, tied at the node X, form a first input of the I/O buffer circuit 106 (hereinafter "input X"); respective gates of the transistors M3 and M4, tied at the node Y, form a second input of the I/O buffer circuit 106 (hereinafter "input Y"); and respective gates of the transistors M5 and M6, tied at node "Z," form an output of the I/O buffer circuit 106 (hereinafter "output Z"). In some embodiments, the output Z is coupled to the core logic circuit 108. In some embodiments, a drain of the transistor M1 is coupled to a source of the transistor M2 at a common node coupled to a source of the transistor M5; a source of the transistor M3 is coupled to a drain of the transistor M4 at a common node coupled to a source of the transistor M6; and such stacked pairs of transistors (M1 and M2) and (M3 and M4) are coupled to the node Z. In some embodiments, drains of the transistors M5 and M6 are coupled to the supply voltages 203 (VSS) and 205 (VDD), respectively.

In order to cause the swing reduction circuit 104 to reduce the voltage swing received by the I/O buffer circuit 106, in some embodiments, the p-type swing reduction circuit 104P and n-type swing reduction circuit 104N are configured to increase the magnitude of a voltage present at the node X when the magnitude of the supply voltage 201 is equal to VSS and decrease the magnitude of a voltage present at the node Y when the magnitude of the supply voltage 201 is equal to VDD, respectively.

For example, while increasing the magnitude of the voltage present at the node X (i.e., when the magnitude of supply voltage 201=VSS), since the increased amount of voltage is predefined and substantially small with respect to VDD (which corresponds to the logic high state), in some embodiments, the I/O buffer circuit 106 may receive the logic state present at the node X as a logic low state ("logic 0"). In some embodiments, the increased amount of the voltage at the node X is substantially equal to a threshold voltage of the transistor 202. On the other hand, since the magnitude of the voltage present at the node Y remains at VSS (as the transistor 204 is turned on to be in the linear conduction mode), in some embodiments, the I/O buffer circuit 106 may receive the logic state present at the node Y as logic 0, as well. As such, when the magnitude of supply voltage 201=VSS, the I/O buffer circuit 106 receives its both inputs (inputs X and Y) as logic 0 but with the voltage magnitude at the node X increased by the threshold voltage of the transistor 202. FIG. 2C illustrates an exemplary comparison of voltage magnitudes at different nodes of the p-type swing reduction circuit 104P and the n-type swing reduction circuit 104N in FIG. 2A, in accordance with some embodiments. As shown in the exemplary comparison 231 of FIG. 2C, when the voltage magnitude (V_PAD) 201 at the pad 102 is equal to VSS, the voltage magnitude (V_PAD_P) at the node X is increased by the threshold voltage (Vth (MPa)) of the transistor 202.

While decreasing the magnitude of the voltage present at the node Y (i.e., when the magnitude of supply voltage 201=VDD), since the decreased amount of voltage is predefined and substantially small with respect to VDD (which corresponds to the logic high state), in some embodiments, the I/O buffer circuit 106 may receive the logic state present at the node Y as a logic high state ("logic 1"). In some embodiments, the decreased amount of the voltage at the node Y is substantially equal to a threshold voltage of the transistor 204. On the other hand, since the magnitude of the voltage present at the node X remains at VDD (as the transistor 202 is turned on to be in the linear conduction mode), in some embodiments, the I/O buffer circuit 106 may receive the logic state present at the node X as logic 1, as well. As such, when the magnitude of supply voltage 201=VDD, the I/O buffer circuit 106 receives its both inputs (inputs X and Y) as logic 1 but with the voltage magnitude at the node Y decreased by the threshold voltage of the transistor 204. As shown in the exemplary comparison 232 of FIG. 2C, when the voltage magnitude (V_PAD) 201 at the pad 102 is equal to VDD, the voltage magnitude (V_PAD_N) at the node Y is decreased by the threshold voltage (Vth(MNa)) of the transistor 204.

In some embodiments, the I/O buffer circuit 106, implemented as the Schmitt Trigger circuit, functions as a level-detecting comparator with a hysteresis window. Its output (e.g., output Z) transitions from logic 0 to logic 1 when an increasing input voltage crosses an upper switching threshold $V_{hi}$, and reverts back to its initial logic state only when the input voltage crosses a lower threshold level $V_{lo}$ which is less than $V_{hi}$. The difference between the two threshold levels, $V_{hi}$–$V_{lo}$, is the hysteresis window associated with the Schmitt Trigger circuit. Since the Schmitt Trigger circuit is known by persons of ordinary skill in the art, operation of the I/O buffer circuit 106 will only be briefly described below.

In operation, assume that the logic states at the input X and Y are initially logic 0 (e.g., when the magnitude of supply voltage 201=VSS as mentioned above). The transistors M1 and M2 will thus be turned on, while the transistors M3 and M4 will be turned off, which ties the output Z to VDD, i.e., logic 1. In turn, the transistor M5 is held to be turned off and the transistor M6 is held to be turned on to set node "A" at logic 1.

Assume now that the voltages at the nodes X and Y begin to rise (e.g., when the magnitude of supply voltage 201 transitions to VDD). When the voltages have become great enough, the transistors M3 and M4 will become conducted (i.e., turned on), while the transistors M1 and M2 will be turned off. When the conducted transistor M4 connects the node A to the supply voltage 203 (VSS, or ground), which in turn grounds the output Z through the also conducted transistor M3, i.e., the output Z transitioning to logic 0. However, the transistor M4 has to overcome the connection of VDD to the node A (through the transistor M6) before it can place the output Z in logic 0. Relative sizes of the transistors M3, M4, and M6 are selected to set the upper switching threshold $V_{hi}$ at which the output Z transitions from logic 0 to logic 1. Conversely, once the output Z is at logic 0, the transistor M5 is held being turned on by virtue of its gate's ground connection through the transistors M3 and M4, while the transistors M1 and M2 are held being turned off. For the I/O buffer circuit 106 to revert the output Z to logic 1 when the voltages at the node X and Y fall, the transistor M1 has to become conductive enough to overcome the grounding effects of the transistor M5 and set node "B" at logic 1. This is the point at which the I/O buffer circuit 106 switches back to logic 0, and relative sizes of the transistors M1, M2, and M5 are selected so that the lower switching threshold $V_{lo}$ at which the output Z transitions from logic 1 to logic 0, provides the proper amount of hysteresis window.

As mentioned above, the magnitude of the supply voltage 201, received by the bonding pad 102, generally ranges from VSS to VDD, which may cause damage (e.g., BTI effects) to the I/O buffer circuit 106 over the time of use. To advantageously minimize the BTI effects, the p-type swing reduction circuit 104P and n-type swing reduction circuit 104N of the present disclosure are configured to increase the magnitude of a voltage received by the gates of the p-type transistors of the I/O buffer circuit 106, for example, the transistors M1 and M2 (i.e., the magnitude of the voltage present at the node X) from VSS when the magnitude of the supply voltage 201 is equal to VSS and decrease the magnitude of a voltage received by the gates of the n-type transistors of the I/O buffer circuit 106, for example, the transistors M3 and M4 (i.e., the magnitude of the voltage present at the node Y) from VDD when the magnitude of the supply voltage 201 is equal to VDD, respectively. More specifically, the increased magnitude of voltage is predefined as the threshold voltage of the p-type swing reduction circuit 104P's transistor 202; and the decreased magnitude of voltage is predefined as the threshold voltage of the n-type swing reduction circuit 104N's transistor 204. Accordingly, the voltage swing received by the transistors M1 and M2 can be advantageously reduced to VDD (when the supply voltage 201 is equal to VDD) minus a sum of the threshold voltage of the transistor 202 and VSS (when the supply voltage 201 is equal to VSS); and the voltage swing received by the transistors M3 and M4 can be advantageously reduced to VDD minus the threshold voltage of the transistor 204 (when the supply voltage 201 is equal to VDD) then minus VSS (when the supply voltage 201 is equal to VSS).

In one embodiment, the p-type swing reduction circuit 104P can reduce the input buffer BTI degradation from 8.11% corresponding to an overdesign on the I/O buffer circuit to 3.91%. In another embodiment, the p-type swing reduction circuit 104P can achieve a much smaller device size and/or a much better timing performance compared with an overdesign on the I/O buffer circuit.

Figure 2B:
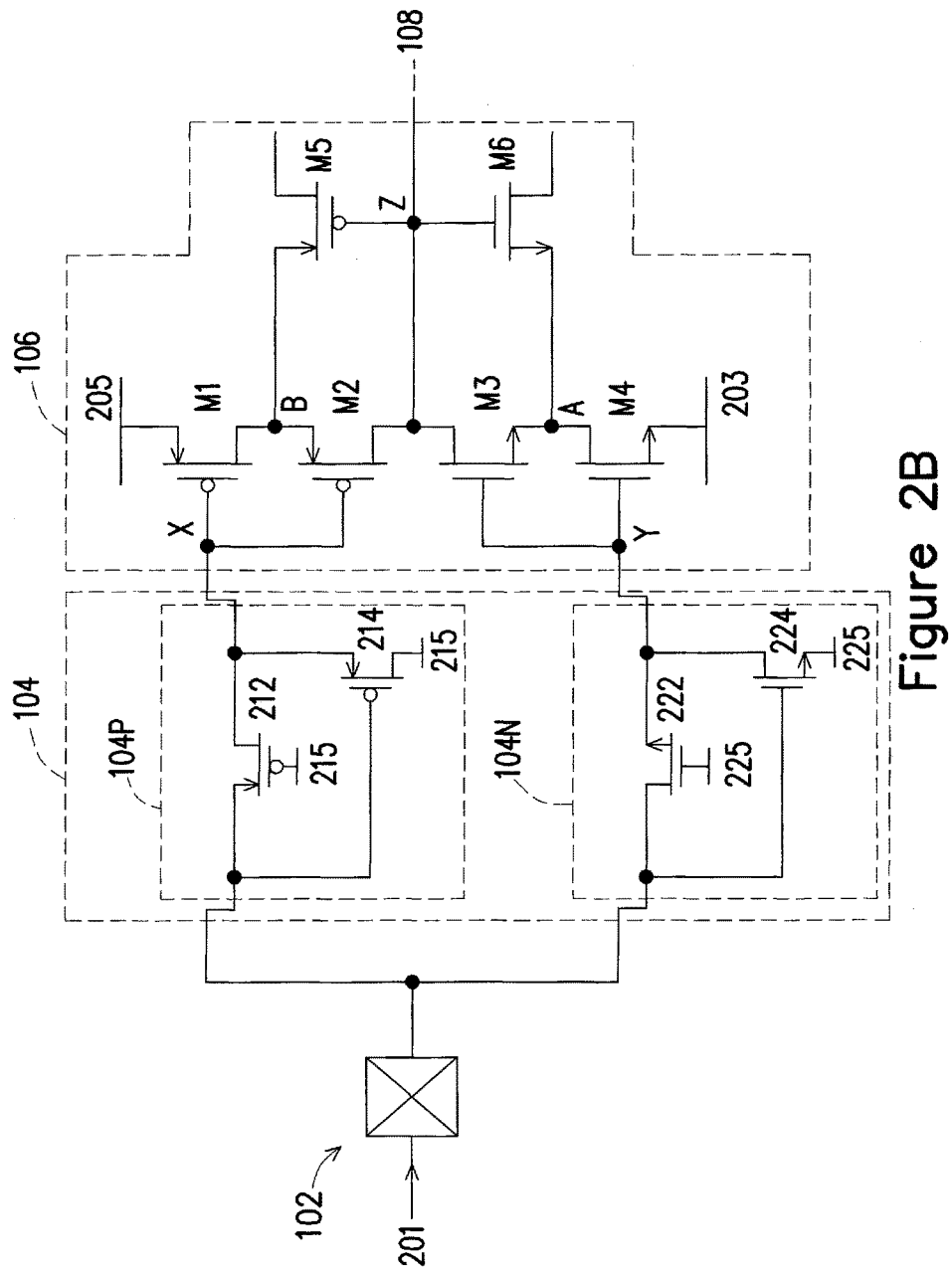
FIG. 2B illustrates another exemplary circuit diagram of the swing reduction circuit, in accordance with some embodiments.
Figure 2C:
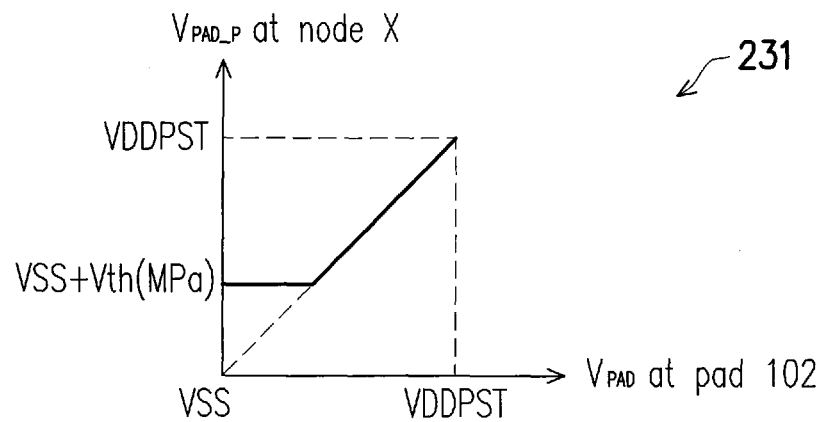
FIG. 2C illustrates an exemplary comparison of voltage magnitudes at different nodes of a swing reduction circuit, in accordance with some embodiments.
Figure 2C:
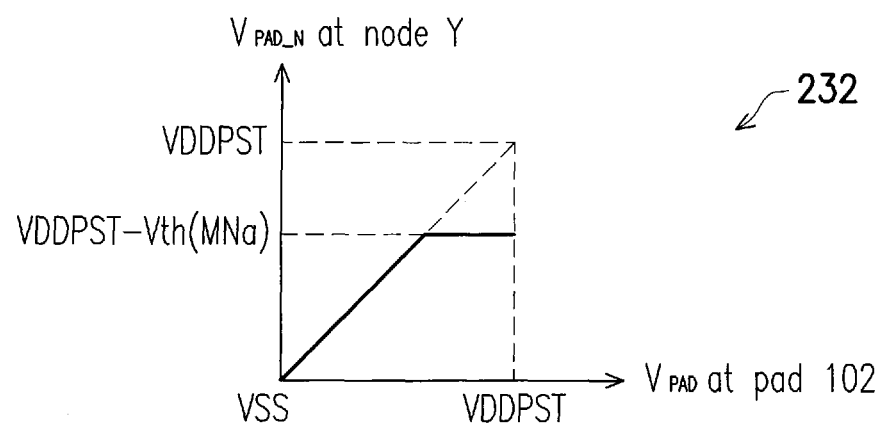

FIG. 2B illustrates respective schematic diagrams of the p-type swing reduction circuit 104P and the n-type swing reduction circuit 104N, in accordance with another embodiment of the present disclosure. In the illustrated embodiment of FIG. 2B, the p-type swing reduction circuit 104P and the n-type swing reduction circuit 104N are respectively coupled between the bonding pad 102 and the I/O buffer circuit 106, which is also implemented by a Schmitt Trigger circuit. For purposes of brevity, the discussion of the I/O buffer circuit 106 will not be repeated below.

In the illustrated embodiment of FIG. 2B, the p-type swing reduction circuit 104P includes transistors 212 and 214; and the n-type swing reduction circuit 104N includes transistors 222 and 224. Although the transistors 212 and 214 are each implemented by a pMOSFET and the transistors 222 and 224 are each implemented by an nMOSFET in FIG. 2B, it is understood that the transistors 212 to 224 can be implemented by any of other transistors while remaining within the scope of the present disclosure. In some embodiments, the transistors 212 and 214 of the p-type swing reduction circuit 104P are gated by a supply voltage 215 and drained by the supply voltage 215, respectively, whose magnitude (hereinafter "Vbias_P") is between VSS and VDD; and the transistors 222 and 224 of the n-type swing reduction circuit 104N are gated by a supply voltage 225 and sourced by the supply voltage 225, respectively, whose magnitude (hereinafter "Vbias_N") is between VSS and VDD.

More specifically, in the p-type swing reduction circuit 104P of FIG. 2B, a source of the transistor 212 and a gate of the transistor 214 are commonly coupled to the bonding pad 102, and a drain of the transistor 212 and a source of the transistor 214 are commonly coupled to the node X (i.e., the respective gates of the pMOSFETs of the I/O buffer circuit 106). In the n-type swing reduction circuit 104N of FIG. 2B, a drain of the transistor 222 and a gate of the transistor 224 are commonly coupled to the bonding pad 102, and a source of the transistor 222 and a drain of the transistor 224 are commonly coupled to the node Y (i.e., the respective gates of the nMOSFETs of the I/O buffer circuit 106).

Similar as the embodiment with reference to FIG. 2A, in order to cause the swing reduction circuit 104 to reduce the voltage swing received by the I/O buffer circuit 106, in some embodiments, the p-type swing reduction circuit 104P and n-type swing reduction circuit 104N are configured to increase the magnitude of the voltage present at the node X when the magnitude of the supply voltage 201 received by the bonding pad 102 is equal to VSS and decrease the magnitude of the voltage present at the node Y when the magnitude of the supply voltage 201 is equal to VDD, respectively, except that the increased magnitude is determined according to Vbias_P (i.e., the magnitude of the supply voltage 215) and the decreased magnitude is determined according to Vbias_N (i.e., the magnitude of the supply voltage 225).

For example, while increasing the magnitude of the voltage present at the node X (i.e., when the magnitude of supply voltage 201=VSS), the transistor 214 is gated by VSS, which corresponds to logic 0. Thus, the transistor 214 is turned on. In some embodiments, since Vbias_P, at which the gate of the transistor 212 is biased, is greater than VSS, at which the source of the transistor 212 is biased, the transistor 212 may be turned off. Accordingly, the voltage magnitude present at the node X is pulled to be substantially equal to the voltage at which the drain of the transistor 214 is biased, i.e., Vbias_P. In some embodiments, Vbias_P is selected to be slightly greater than VSS, the I/O buffer circuit 106 may still receive the logic state present at the node X as logic 0. On the other hand, the transistor 224 is also gated by VSS such that the transistor 224 is turned off. And the transistor 222 is gated by Vbias_N, which is slightly greater than VSS, so that the transistor 222 may be turned on, according to some embodiments. As such, the voltage magnitude present at the node Y (the voltage present at the transistor 222's source) is substantially equal to VSS (the voltage present at the transistor 222's drain), which causes the I/O buffer circuit 106 to receive the logic state present at the node Y as logic 0, as well.

Figure 2D:
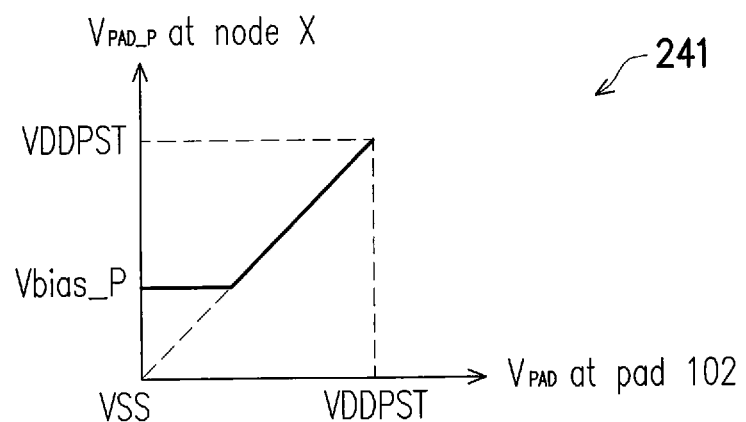
FIG. 2D illustrates another exemplary comparison of voltage magnitudes at different nodes of a swing reduction circuit, in accordance with some embodiments.
Figure 2D:
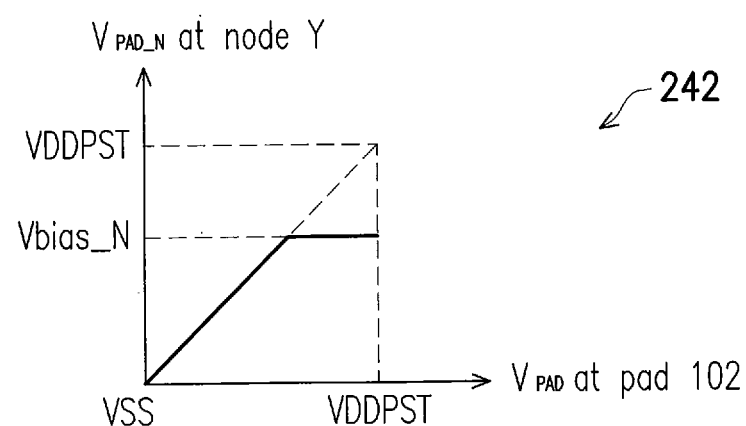

In some embodiments, accordingly, the magnitude of the voltage present at the node X (the magnitude of the voltage received by the transistors M1 and M2) can be increased from VSS to Vbias_P when the supply voltage 201 is equal to VSS. FIG. 2D illustrates an exemplary comparison of voltage magnitudes at different nodes of the p-type swing reduction circuit 104P and the n-type swing reduction circuit 104N in FIG. 2B, in accordance with some embodiments. As shown in the exemplary comparison 241 of FIG. 2D, when the voltage magnitude (V_PAD) 201 at the pad 102 is equal to VSS, the voltage magnitude (V_PAD_P) at the node X is increased from VSS to Vbias_P. Thus, the voltage swing received by the transistors M1 and M2 can be advantageously reduced to VDD (when the supply voltage 201 is equal to VDD) minus Vbias_P (when the supply voltage 201 is equal to VSS).

While decreasing the magnitude of the voltage present at the node Y (i.e., when the magnitude of supply voltage 201=VDD), the transistor 224 is gated by VDD, which corresponds to logic 1. Thus, the transistor 224 is turned on. In some embodiments, since Vbias_N, at which the gate of the transistor 222 is biased, is less than VDD, at which the gate of the transistor 224 is biased, the transistor 222 may be less conductive than the transistor 224. Accordingly, the voltage magnitude present at the node Y is pulled to be substantially equal to the voltage at which the source of the transistor 224 is biased, i.e., Vbias_N. In some embodiments, Vbias_N is selected to be slightly less than VDD, the I/O buffer circuit 106 may still receive the logic state present at the node Y as logic 1. On the other hand, the transistor 214 is also gated by VDD such that the transistor 214 is turned off. And the transistor 212 is gated by Vbias_P, which is less than VDD, so that the transistor 212 may be turned on, according to some embodiments. As such, the voltage magnitude present at the node X (the voltage present at the transistor 212's drain) is substantially equal to VDD (the voltage present at the transistor 212's source), which causes the I/O buffer circuit 106 to receive the logic state present at the node X as logic 1, as well.

In some embodiments, accordingly, the magnitude of the voltage present at the node Y (the magnitude of the voltage received by the transistors M3 and M4) can be decreased from VDD to Vbias_N when the supply voltage 201 is equal to VDD. As shown in the exemplary comparison 242 of FIG. 2D, when the voltage magnitude (V_PAD) 201 at the pad 102 is equal to VDD, the voltage magnitude (V_PAD_N) at the node Y is decreased from VDD to Vbias_N. Thus, the voltage swing received by the transistors M3 and M4 can be advantageously reduced to Vbias_N (when the supply voltage 201 is equal to VDD) minus VSS (when the supply voltage 201 is equal to VSS).

Figure 3:
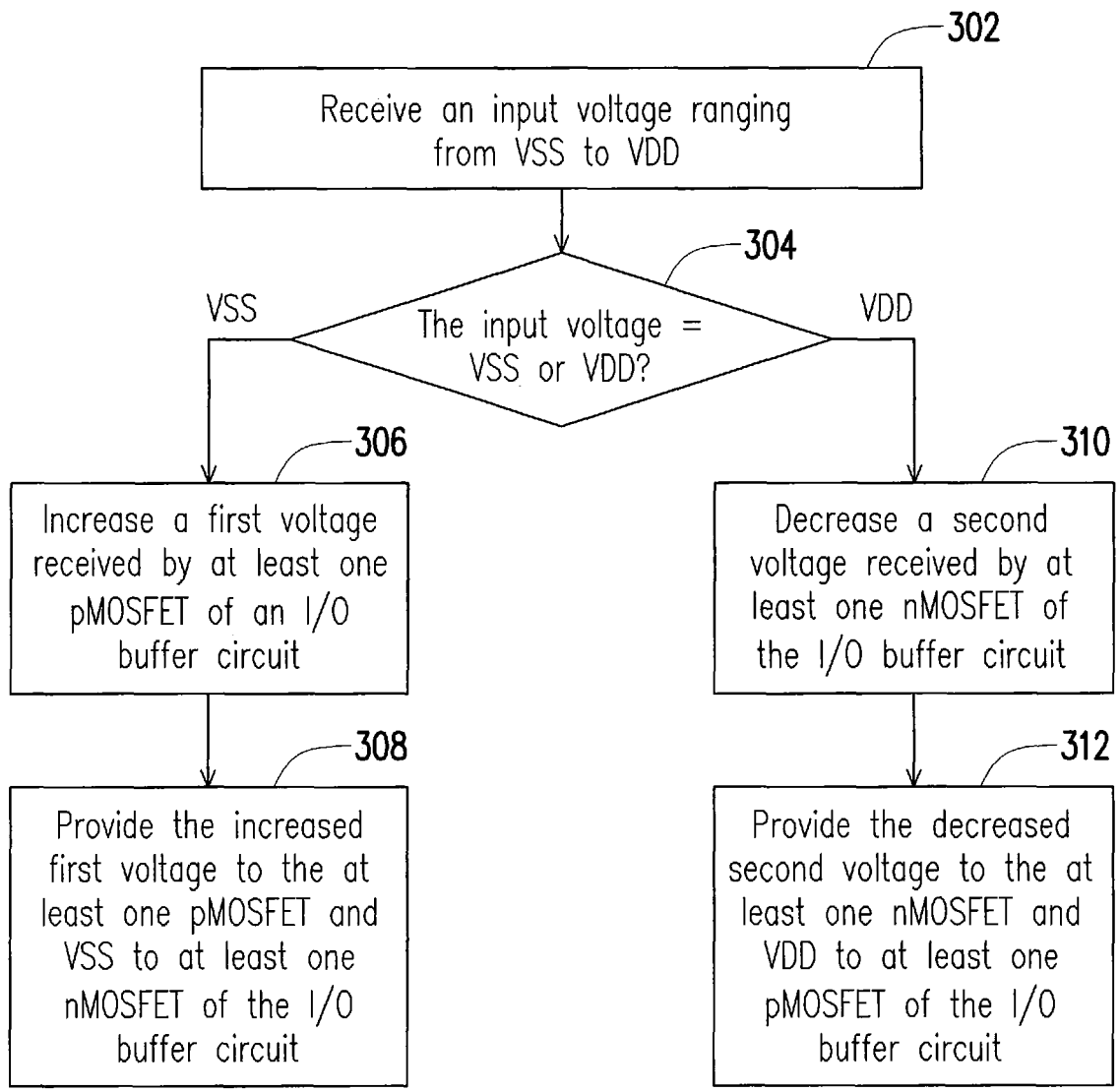
FIG. 3 illustrates a flow chart of an exemplary method to operate the swing reduction circuit of FIG. 1, in accordance with various embodiments.

FIG. 3 illustrates a flow chart of an exemplary method 300 to operate the swing reduction circuit 104, in accordance with various embodiments. In various embodiments, the operations of the method 300 are performed by the respective components illustrated in FIGS. 1-2B. For purposes of discussion, the following embodiment of the method 300 will be described in conjunction with FIGS. 1-2B. The illustrated embodiment of the method 300 is merely an example. Therefore, it should be understood that any of a variety of operations may be omitted, re-sequenced, and/or added while remaining within the scope of the present disclosure.

The method 300 starts with operation 302 in which an input voltage ranging from VSS to VDD is received. For example, the input voltage may be a supply voltage (e.g., the supply voltage 201) that is received by a bonding pad (e.g., the bonding pad 102). As mentioned above, such a supply voltage 201 received by the bonding pad 102 typically ranges from VSS, which is a minimum nominal supply voltage, to VDD, which is a maximum nominal supply voltage.

The method 300 continues to operation 304 in which the input voltage is determined as being equal to VSS or VDD. Continuing with the above example, when the supply voltage 201 is equal to VSS, the method proceeds to operation 306 and the following operation, and when the supply voltage 201 is equal to VDD, the method proceeds to operation 310 and the following operation, which will be respectively discussed below.

Referring first to the operation 306, a first voltage received by at least one pMOSFET of an I/O buffer circuit is increased. Using the same example, when the supply voltage 201 is equal to VSS, the p-type swing reduction circuit 104P of the swing reduction circuit 104 is configured to increase the voltage present at the node X, which corresponds to the first voltage discussed herein, from VSS by either the threshold voltage of the transistor 202 (as described with reference to FIG. 2A) or the magnitude of the supply voltage 215, Vbias_P (as described with reference to FIG. 2B).

Next, the method 300 continues to operation 308 in which the increased first voltage is provided to the at least one pMOSFET of the I/O buffer circuit and VSS is provided to at least one nMOSFET of the I/O buffer circuit. Still with the same example, the pMOSFETs of the I/O buffer circuit 106 (e.g., the transistors M1 and M2) receive the increased first voltage, i.e., the voltage present at the node X, as their respective inputs while the nMOSFETs of the I/O buffer circuit 106 (e.g., the transistors M3 and M4) still receive VSS as their respective inputs.

Referring then to operation 310, a second voltage received by at least one nMOSFET of the I/O buffer circuit is decreased. Using the same example, when the supply voltage 201 is equal to VDD, the n-type swing reduction circuit 104N of the swing reduction circuit 104 is configured to decrease the voltage present at the node Y, which corresponds to the second voltage discussed herein, from VDD by either the threshold voltage of the transistor 204 (as described with reference to FIG. 2A) or the magnitude of the supply voltage 225, Vbias_N (as described with reference to FIG. 2B).

Next, the method 300 continues to operation 312 in which the decreased second voltage is provided to the at least one nMOSFET of the I/O buffer circuit and VDD is provided to at least one pMOSFET of the I/O buffer circuit. Still with the same example, the nMOSFETs of the I/O buffer circuit 106 (e.g., the transistors M3 and M4) receive the decreased second voltage, i.e., the voltage present at the node Y, as their respective inputs while the pMOSFETs of the I/O buffer circuit 106 (e.g., the transistors M1 and M2) still receive VDD as their respective inputs.

In an embodiment, a circuit includes: a first swing reduction circuit coupled between an input/output pad and a buffer circuit, and a second swing reduction circuit coupled between the input/output pad and the buffer circuit. The first swing reduction circuit comprises a first transistor gated by a first bias voltage and comprises a second transistor drained by the first bias voltage. The first swing reduction circuit is configured to increase a voltage at a first node in the buffer circuit when a voltage applied on the input/output pad is equal to a first supply voltage. The second swing reduction circuit is configured to reduce a voltage at a second node in the buffer circuit when the voltage applied on the input/output pad is equal to a second supply voltage.

In another embodiment, a circuit includes: a first swing reduction circuit coupled between an input/output pad and a buffer circuit; and a second swing reduction circuit coupled between the input/output pad and the buffer circuit. The first swing reduction circuit comprises a first p-type metal-oxide-semiconductor field-effect-transistor gated by a first bias voltage and comprises a second p-type metal-oxide-semiconductor field-effect-transistor drained by the first bias voltage.

In yet another embodiment, a method includes: receiving an input voltage ranging from a first supply voltage to a second supply voltage; and either increasing a first voltage at a first node in a buffer circuit in response to the input voltage being equal to the first supply voltage, or decreasing a second voltage at a second node in the buffer circuit in response to the input voltage being equal to the second supply voltage. The first voltage is increased to a first bias voltage applied to a gate of a first transistor that is coupled between the input voltage and the first node.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A circuit, comprising:
a first swing reduction circuit coupled between an input/output pad and a buffer circuit, wherein the first swing reduction circuit comprises a first transistor gated by a first bias voltage and comprises a second transistor drained by the first bias voltage; and
a second swing reduction circuit coupled between the input/output pad and the buffer circuit,
wherein the first swing reduction circuit is configured to increase a voltage at a first node in the buffer circuit when a voltage applied on the input/output pad is equal to a first supply voltage, and the second swing reduction circuit is configured to reduce a voltage at a second node in the buffer circuit when the voltage applied on the input/output pad is equal to a second supply voltage.

2. The circuit of claim 1, wherein the second supply voltage is higher than the first supply voltage.

3. The circuit of claim 1, wherein the first supply voltage is a ground voltage (VSS) and the second supply voltage is a power supply voltage (VDD).

4. The circuit of claim 1, wherein:
the first node is coupled to gates of a set of p-type metal-oxide-semiconductor field-effect-transistors; and
the second node is coupled to gates of a set of n-type metal-oxide-semiconductor field-effect-transistors.

5. The circuit of claim 1, wherein a source of the first transistor is coupled to the input/output pad, and a drain of the first transistor is coupled to the first node in the buffer circuit.

6. The circuit of claim 1, wherein the first bias voltage is higher than the first supply voltage but lower than the second supply voltage.

7. The circuit of claim 6, wherein a source of the first transistor and a gate of the second transistor are both coupled to the input/output pad, and a drain of the first transistor and a source of the second transistor are both coupled to the first node in the buffer circuit.

8. The circuit of claim 1, wherein the second swing reduction circuit comprises an n-type metal-oxide-semiconductor field-effect-transistor, a gate of the n-type metal-oxide-semiconductor field-effect-transistor being coupled to the second supply voltage, a drain of the n-type metal-oxide-semiconductor field-effect-transistor being coupled to the input/output pad, and a source of the n-type metal-oxide-semiconductor field-effect-transistor being coupled to the second node in the buffer circuit.

9. The circuit of claim 1, wherein the second swing reduction circuit comprises a first n-type metal-oxide-semiconductor field-effect-transistor gated by a second bias voltage, and a second n-type metal-oxide-semiconductor field-effect-transistor sourced by the second bias voltage, the second bias voltage being higher than the first supply voltage but lower than the second supply voltage.

10. The circuit of claim 9, wherein a drain of the first n-type metal-oxide-semiconductor field-effect-transistor and a gate of the second n-type metal-oxide-semiconductor field-effect-transistor are both coupled to the input/output pad, and a source of the first n-type metal-oxide-semiconductor field-effect-transistor and a drain of the second n-type metal-oxide-semiconductor field-effect-transistor are both coupled to the second node in the buffer circuit.

11. A circuit, comprising:
a first swing reduction circuit coupled between an input/output pad and a buffer circuit, wherein the first swing reduction circuit comprises a first p-type metal-oxide-semiconductor field-effect-transistor gated by a first bias voltage and comprises a second p-type metal-oxide-semiconductor field-effect-transistor drained by the first bias voltage; and
a second swing reduction circuit coupled between the input/output pad and the buffer circuit.

12. The circuit of claim 11, wherein:
the first swing reduction circuit is configured to increase an input voltage in response to the input voltage being equal to a first supply voltage and provide the increased input voltage to the buffer circuit.

13. The circuit of claim 12, wherein the first bias voltage is higher than the first supply voltage.

14. The circuit of claim 11, wherein:
the second swing reduction circuit is configured to decrease the input voltage in response to the input voltage being equal to a second supply voltage and provide the decreased input voltage to the buffer circuit.

15. The circuit of claim 14, wherein the first bias voltage is lower than the second supply voltage.

16. The circuit of claim 11, wherein the first p-type metal-oxide-semiconductor field-effect-transistor comprises: a source coupled to the input/output pad, and a drain coupled to respective gates of at least one p-type metal-oxide-semiconductor field-effect-transistor of the buffer circuit.

17. The circuit of claim 11, wherein:
the second swing reduction circuit comprises an n-type metal-oxide-semiconductor field-effect-transistor; and
the n-type metal-oxide-semiconductor field-effect-transistor comprises a drain coupled to the input/output pad, and a source coupled to respective gates of at least one n-type metal-oxide-semiconductor field-effect-transistor of the buffer circuit.

18. A method, comprising:
receiving an input voltage ranging from a first supply voltage to a second supply voltage; and
either increasing a first voltage at a first node in a buffer circuit in response to the input voltage being equal to the first supply voltage, or decreasing a second voltage at a second node in the buffer circuit in response to the input voltage being equal to the second supply voltage, wherein the first voltage is increased to a first bias voltage applied to a gate of a first transistor that is coupled between the input voltage and the first node.

19. The method of claim 18, wherein the second voltage is decreased to a second bias voltage applied to a gate of a second transistor that is coupled between the input voltage and the second node.

20. The method of claim 18, wherein the first voltage is received by a gate of at least one p-type metal-oxide-semiconductor field-effect-transistor of the buffer circuit and the second voltage is received by a gate of at least one n-type metal-oxide-semiconductor field-effect-transistor of the buffer circuit.

\* \* \* \* \*